(12) United States Patent
Tsai

(10) Patent No.: US 7,394,241 B2
(45) Date of Patent: Jul. 1, 2008

(54) METHOD AND APPARATUS FOR TESTING POWER SWITCHES USING A LOGIC GATE TREE

(75) Inventor: Yu-Wen Tsai, Hsin-Chu (TW)

(73) Assignee: Faraday Technology Corp., Hsin-Chu (TW)

( * ) Notice: Subject to any disclaimer, the term of this patent is extended or adjusted under 35 U.S.C. 154(b) by 185 days.

(21) Appl. No.: 11/380,217

(22) Filed: Apr. 26, 2006

(65) Prior Publication Data

US 2007/0252581 A1    Nov. 1, 2007

(51) Int. Cl.
    *G01R 31/28* (2006.01)
(52) U.S. Cl. .................. 324/158.1; 324/769
(58) Field of Classification Search ........... None
    See application file for complete search history.

(56) References Cited

U.S. PATENT DOCUMENTS

| 6,449,748 | B1 * | 9/2002 | Jeng et al. ............... 716/4 |
| 6,806,726 | B2 * | 10/2004 | Okada et al. ............ 324/765 |
| 7,231,572 | B2 * | 6/2007 | Clark ..................... 714/742 |

* cited by examiner

*Primary Examiner*—Vinh P Nguyen
(74) *Attorney, Agent, or Firm*—Winston Hsu

(57) ABSTRACT

A method for testing power switches using a logic gate tree, the method includes providing a logic gate tree electrically connected to a plurality of power switches, each output node of the plurality of power switches being electrically connected to a corresponding input node of a logic gate of the logic gate tree; applying a pattern of control signals to the plurality of power switches for controlling on-off states of the plurality of power switches; and determining whether an output voltage signal of an output node of the logic gate tree matches a predetermined value corresponding to the pattern of control signals.

12 Claims, 7 Drawing Sheets

| Cycle | C21 | C22 | C23 | OUT2 |
|---|---|---|---|---|
| 1 | 0 | 0 | 0 | 0 |
| 2 | 1 | 0 | 0 | 1 |
| 3 | 1 | 1 | 0 | 0 |
| 4 | 1 | 1 | 1 | 1 |
| 5 | 1 | 1 | 0 | 0 |
| 6 | 1 | 0 | 0 | 1 |
| 7 | 0 | 0 | 0 | 0 |

| Cycle | SL1 | SL2 | SL3 | O |
|-------|-----|-----|-----|---|
| 1 | 1 | 1 | 1 | 0 |
| 2 | 1 | 1 | 0 | 1 |
| 3 | 1 | 0 | 0 | 0 |
| 4 | 0 | 0 | 0 | 1 |
| 5 | 1 | 0 | 0 | 0 |
| 6 | 1 | 1 | 0 | 1 |
| 7 | 1 | 1 | 1 | 0 |

Fig. 7

METHOD AND APPARATUS FOR TESTING POWER SWITCHES USING A LOGIC GATE TREE

BACKGROUND OF THE INVENTION

1. Field of the Invention

The present invention relates to a method for testing power switches using a logic gate tree, and more particularly, to a method for testing embedded power switches of an integrated circuit using a logic gate tree.

2. Description of the Prior Art

As related technology keeps improving, integrated circuits become more powerful and smaller, and lower power consumption becomes a basic requirement of the integrated circuits correspondingly. Therefore, ways to control or decrease leakage current inside the integrated circuit is of key importance.

Please refer to FIG. 1, which shows an integrated circuit 100 of the prior art utilizing MOS transistors M1, M2, M3 as power switches to control current flows i1, i2, i3 inside the integrated circuit 100. Because the MOS transistors M1, M2, M3 are capable of switching large amounts of power, the MOS transistors M1, M2, M3 are installed between a power source 140 and corresponding functional circuits 110, 120, 130 of the integrated circuit 100. When the functional circuit 110, 120, 130 is working, the MOS transistor M1, M2, M3 is turned on to provide a path for the current flow i1, i2, i3 from the power source 140 to the functional circuit 110, 120, 130. On the other hand, when the functional circuit 110, 120, 130 is idle, the MOS transistor M1, M2, M3 is turned off to block the current flow i1, i2, i3 from the power source 140 in order to decrease leakage current in the functional circuit 110, 120, 130.

In the prior art, the method for verifying function of the MOS transistors M1, M2, M3 is performed by measuring leakage current at the output nodes B of the MOS transistors M1, M2, M3 one by one. For example, the MOS transistor M1 is turned on and then off (the other MOS transistors M2, M3 are turned off) to measure leakage current at the output node B of the MOS transistor M1. Thereafter, the MOS transistor M2 is turned on and then off (the other MOS transistors M1, M3 are turned off) to measure leakage current at the output node B of the MOS transistor M2. Finally, the MOS transistor M3 is turned on and then off (the other MOS transistors M1, M2 are turned off) to measure leakage current at the output node B of the MOS transistor M3. Therefore, each leakage current of the MOS transistors M1, M2, M3 can be detected to determine whether the MOS transistors M1, M2, M3 work functionally.

However, measuring leakage current level is time consuming, and sometimes the leakage current may be too small to be sensed such that it may cause an error judgment. Moreover, the prior art must measure each leakage current of the MOS transistors one at a time, which is inefficient.

SUMMARY OF THE INVENTION

It is therefore an objective of the claimed invention to provide a method for testing power switches using a logic gate tree in order to solve the problems of the prior art.

The method of the present invention comprises providing a logic gate tree electrically connected to a plurality of power switches, each output node of the plurality of power switches being electrically connected to a corresponding input node of a logic gate of the logic gate tree; applying a pattern of control signals to the plurality of power switches for controlling on-off states of the plurality of power switches; and determining whether an output voltage signal of an output node of the logic gate tree matches a predetermined value corresponding to the pattern of control signals.

The present invention further provides an integrated circuit capable of testing embedded power switches. The integrated circuit comprises a plurality of power switches for controlling current flows according to received corresponding control signals; and a logic gate tree electrically connected to the plurality of power switches for testing the plurality of power switches, each output node of the plurality of power switches being electrically connected to a corresponding input node of a logic gate of the logic gate tree; wherein an output voltage signal of an output node of the logic gate tree indicates whether the plurality of power switches work functionally according to the corresponding control signals.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 7 shows a table providing a set of test patterns of control signals applied to the plurality of NMOS transistors in FIG. 6.

DETAILED DESCRIPTION

Figure 1:
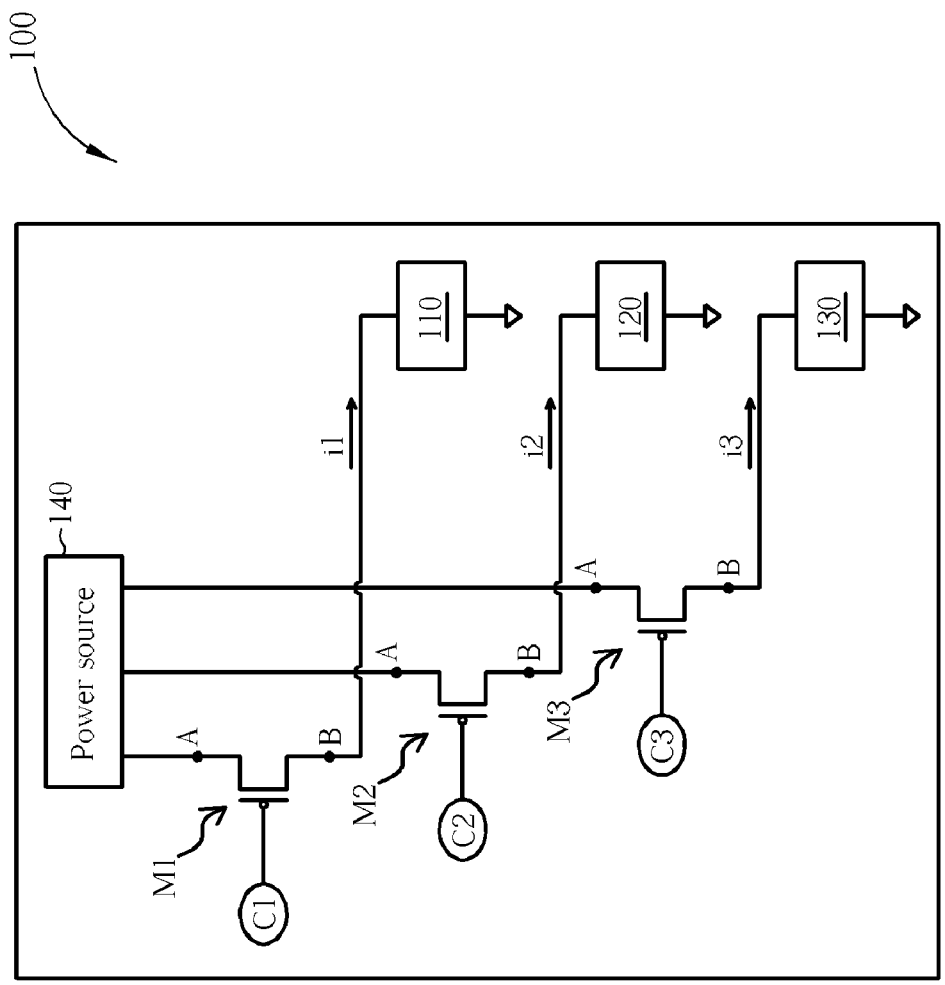
FIG. 1 is a diagram showing an integrated circuit of the prior art utilizing MOS transistors as power switches to control current flows inside the integrated circuit.
Figure 2:
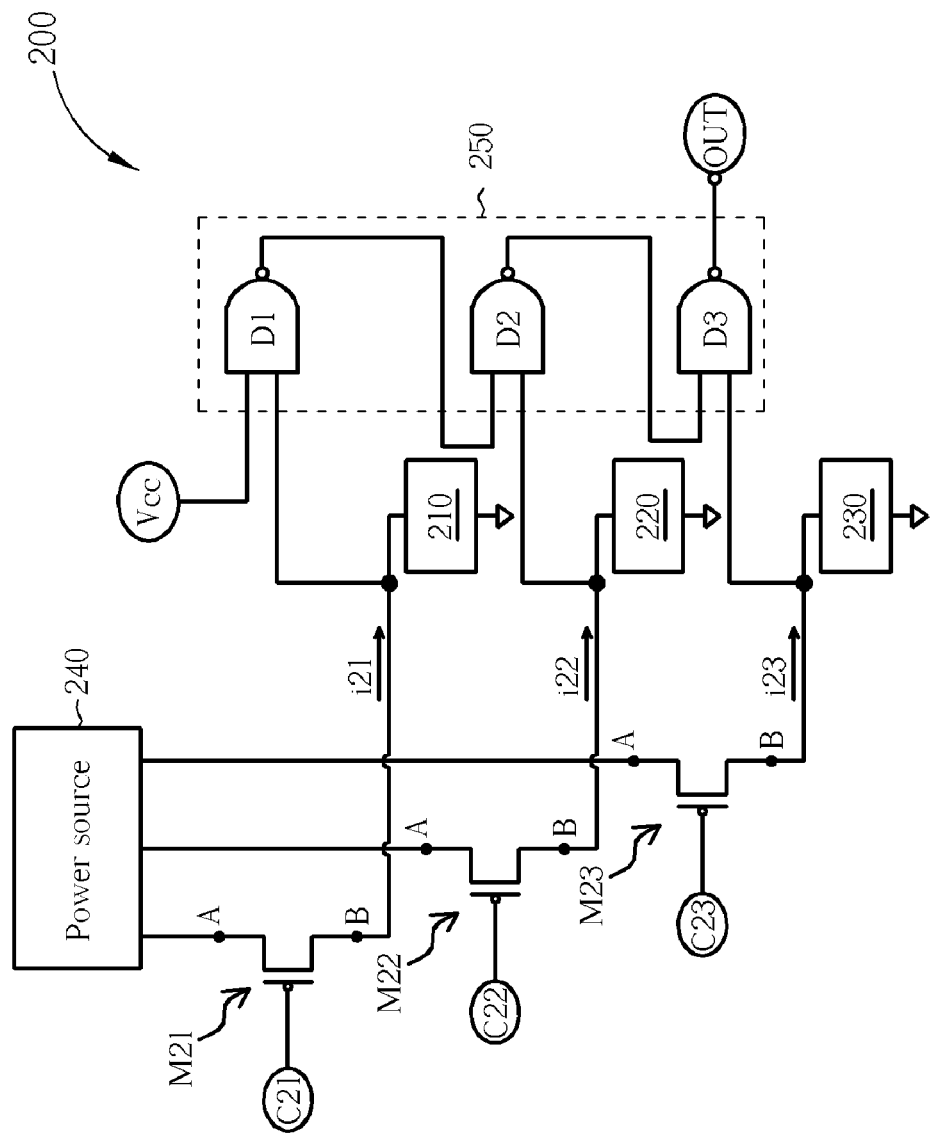
FIG. 2 is a diagram showing an integrated circuit of the present invention using a NAND logic gate tree for testing power switches.

Please refer to FIG. 2, which shows an integrated circuit 200 of the present invention using a NAND logic gate tree 250 for testing PMOS power switches. As shown in FIG. 2, the integrated circuit 200 of the present invention comprises a plurality of functional circuits 210, 220, 230, a plurality of PMOS transistors M21, M22, M23 (power switches), a power source 240, and a NAND logic gate tree 250. The PMOS transistors M21, M22, M23 control current flows i21, i22, i23 to the plurality of functional circuits 210, 220, 230 according to received corresponding control signals C21, C22, C23, and each output node B of the plurality of PMOS transistors M21, M22, M23 is electrically connected to a corresponding input node of a logic gate D1, D2, D3 of the NAND logic gate tree 250. The NAND logic gate tree is capable of testing the MOS transistors.

Figure 3:
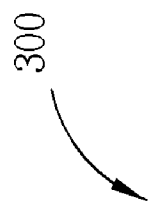
FIG. 3 is a diagram showing a table providing a set of test patterns of control signals applied to the plurality of MOS transistors in FIG. 2.

Please refer to FIG. 3, and refer to FIG. 2 as well. FIG. 3 shows a table 300 providing a set of test patterns of control signals C21, C22, C23 applied to the plurality of PMOS transistors M21, M22, M23 in FIG. 2. In order to verify function of the PMOS transistors M21, M22, M23 of the integrated circuit 200 quickly and efficiently, the present invention applies a pattern of control signals C21, C22, C23 to the PMOS transistors while comparing the output voltage signal OUT1 of the NAND logic gate tree 250 to a corresponding predetermined output value OUT2 shown in the table 300. For example, in cycle 1, all of the PMOS transistors M21, M22, M23 are turned on, if all the PMOS transistors M21, M22, M23 work functionally, the output signal OUT1 of the NAND logic gate tree 250 should be equal to 0 (low). On the other hand, if one of the PMOS transistors M21, M22, M23, such as the PMOS transistor M21 doesn't work functionally, then the output signal OUT1 of the NAND logic gate tree 250 would be equal to 1 (high), which doesn't match the predetermined output value OUT2. Therefore, the present invention can easily and quickly detect whether the PMOS transistors M21, M22, M23 work functionally by just measuring the output voltage level of the output node of the NAND logic gate tree 250 (measuring a voltage level is much easier and quicker than measuring a current level).

In case there is a combination of failed PMOS transistors M21, M22, M23 that makes the output voltage signal OUT1 equal to the predetermined output value OUT2 coincidentally, the present invention applies a plurality of test patterns of control signals C21, C22, C23 to the PMOS transistors M21, M22, M23. As shown in FIG. 3, the table 300 comprises 7 cycles for testing the three PMOS transistors M21, M22, M23, wherein the cycles turns on all the PMOS transistors M21, M22, M23 at first, and then turns off the PMOS transistors M21, M22, M23 one by one in an order, thereafter, turns on the PMOS transistors M21, M22, M23 one by one in a reverse order. However, the present invention doesn't limit the on-off order of the PMOS transistors M21, M22, M23.

Figure 4:
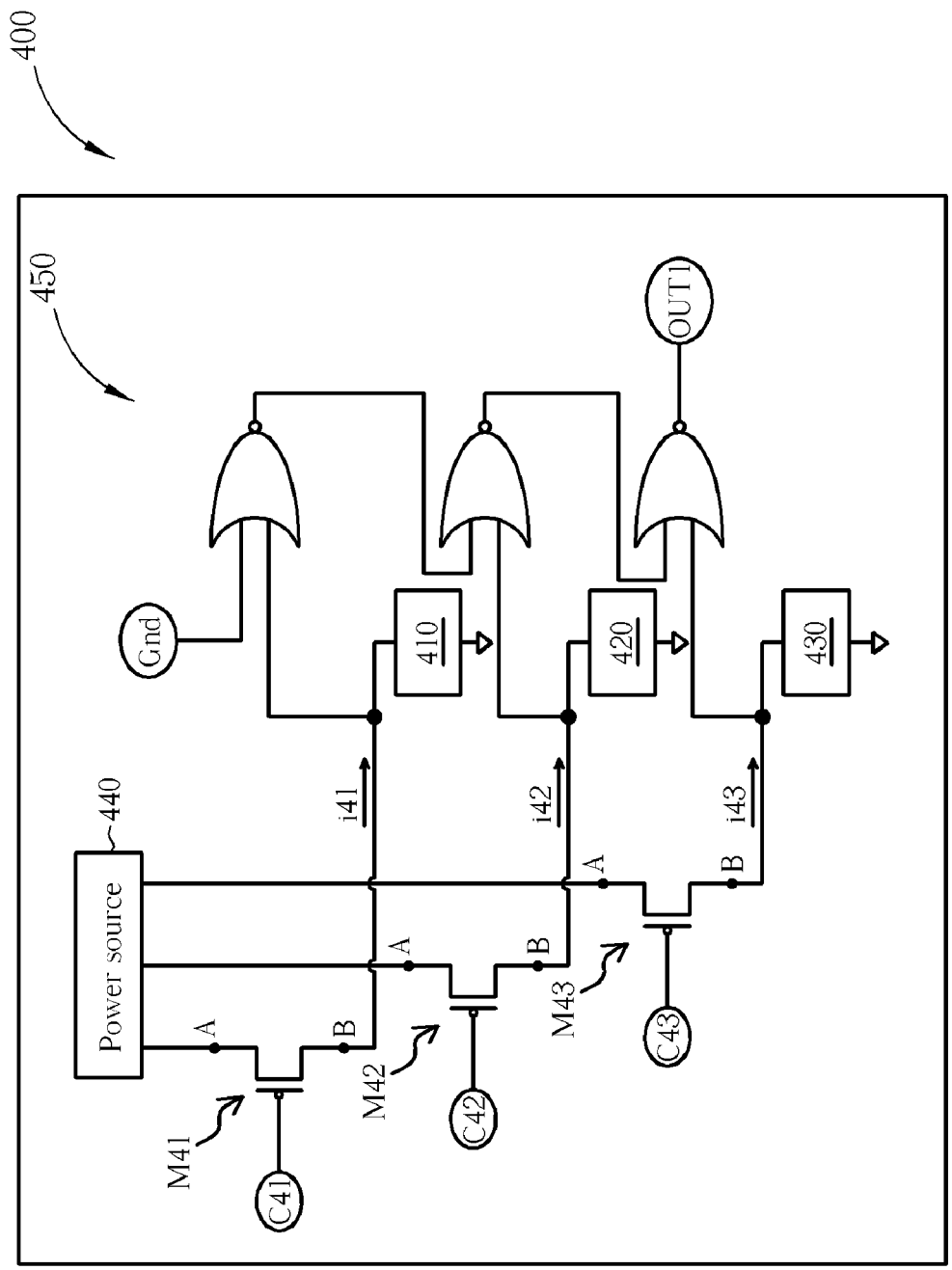
FIG. 4 is a diagram showing another integrated circuit of the present invention using a NOR logic gate tree for testing power switches.

In addition, the present invention also can utilize other types of logic gate tree, such as a NOR logic gate tree to test the power switches. Please refer to FIG. 4, which shows another integrated circuit 400 of the present invention using a NOR logic gate tree 450 for testing power switches. The integrated circuit 400 further comprises functional circuits 410, 420, 430 and power source 440. The test method of the NOR logic gate tree 450 is similar to the above embodiment, where only the predetermined output value OUT2 will be different. Therefore, further description of the embodiment in FIG. 4 is not provided hereby.

Figure 6:
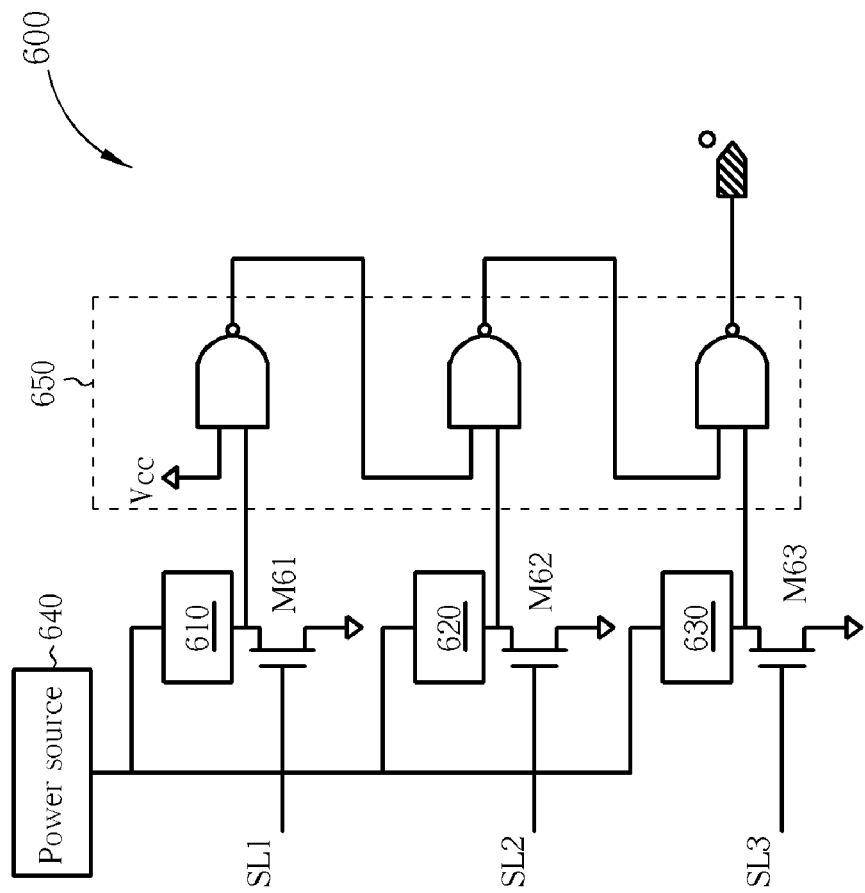
FIG. 6 shows another integrated circuit of the present invention using a NAND logic gate tree for testing NMOS power switches.

Although the power switches are PMOS transistors in the above embodiments, the present invention also can utilize NMOS transistors as power switches. Please refer to FIG. 6 and FIG. 7. FIG. 6 shows another integrated circuit 600 of the present invention using a NAND logic gate tree 650 for testing NMOS power switches. FIG. 7 shows a table 700 providing a set of test patterns of control signals SL1, SL2, SL3 applied to the plurality of NMOS transistors M61, M62, M63 in FIG. 6. The integrated circuit 600 further comprises functional circuits 610, 620, 630 and power source 640. The test method of the NAND logic gate tree 650 is similar to the embodiment in FIG. 2, where only the configuration of the circuit connection is different. Therefore, further description of the embodiment in FIG. 6 and FIG. 7 is not provided hereby.

Figure 5:
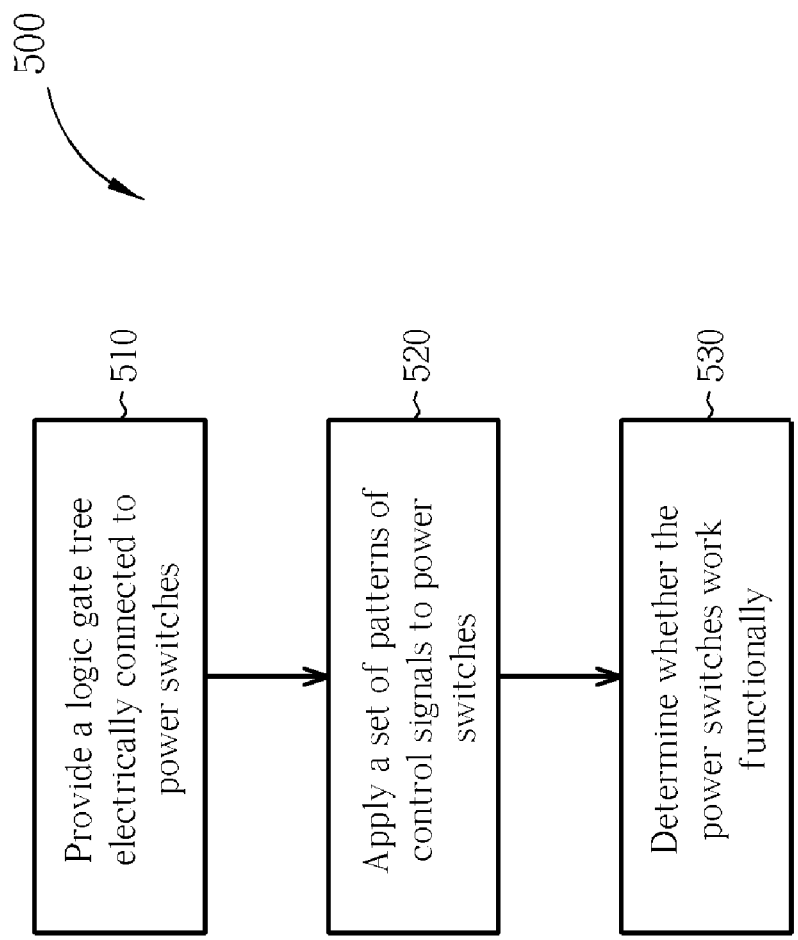
FIG. 5 is a flowchart showing a method of the present invention.

To more clearly illustrate the method for testing power switches using a logic gate tree, FIG. 5 provides a flowchart 500 of the method of the present invention. Please refer to FIG. 5, and refer to FIG. 2 to FIG. 4 as well. The flowchart 500 of FIG. 5 comprises the following steps:

Step 510: Provide a logic gate tree electrically connected to a plurality of power switches, and each output node of the plurality of power switches is electrically connected to a corresponding input node of a logic gate of the logic gate tree;

Step 520: Apply a set of patterns of control signals to a plurality of power switches for controlling on-off states of a plurality of power switches;

Step 530: Determine whether an output voltage signal of an output node of a logic gate tree matches a predetermined value corresponding to the pattern of control signals.

Basically, to achieve the same result, the steps of the flowchart 500 need not be in the exact order shown and need not be contiguous, that is, other steps can be intermediate.

Summarizing the above, the present invention provides a method for testing embedded power switches of an integrated circuit using a logic gate tree. The method of the present invention applies a set of patterns of control signals to a plurality of power switches with comparing an output voltage signal of an output node of the logic gate tree to a predetermined value corresponding to the pattern of control signals.

In contrast to the prior art, the present invention measures output voltage signal to verify the function of the power switches, which is much easier and quicker than measuring leakage current level in the prior art. In addition, the method of the present invention only needs to sense a 0 or 1 state (low or high) of the output voltage signal, such that the present invention can more precisely judge functionality of the power switches even if the leakage current is very small.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for testing power switches using a logic gate tree, the method comprising:
   providing a plurality of power switches electrically connected between a power source and corresponding functional circuits;
   providing a logic gate tree electrically connected to the plurality of power switches, each output node of the plurality of power switches being electrically connected to a corresponding input node of a logic gate of the logic gate tree;
   applying a pattern of control signals to the plurality of power switches for controlling on-off states of the plurality of power switches; and
   determining if the plurality of power switches are defective according to an output voltage signal of an output node of the logic gate tree.

2. The method of claim 1, wherein the logic gate tree is a NAND logic gate tree.

3. The method of claim 1, wherein the logic gate tree is a NOR logic gate tree.

4. The method of claim 1, wherein the plurality of power switches are MOS transistors installed on an integrated circuit.

5. The method of claim 4, wherein the plurality of power switches are PMOS transistors installed on the integrated circuit.

6. The method of claim 4, wherein the plurality of power switches are NMOS transistors installed on the integrated circuit.

7. An integrated circuit capable of testing embedded power switches, the integrated circuit comprising:
   a plurality of power switches electrically connected between a power source and corresponding functional circuits for controlling current flows from the power source to the functional circuits according to received corresponding control signals; and a logic gate tree electrically connected to the plurality of power switches for testing the plurality of power switches, each output node of the plurality of power switches being electrically connected to a corresponding input node of a logic gate of the logic gate tree;

wherein an output voltage signal of an output node of the logic gate tree indicates whether the plurality of power switches are defective.

8. The integrated circuit of claim 7, wherein the logic gate tree is a NAND logic gate tree.

9. The integrated circuit of claim 7, wherein the logic gate tree is a NOR logic gate tree.

10. The integrated circuit of claim 7, wherein the plurality of power switches are MOS transistors.

11. The method of claim 10, wherein the plurality of power switches are PMOS transistors.

12. The method of claim 10, wherein the plurality of power switches are NMOS transistors.

* * * * *